Oct. 4, 1960 D. K. SCHAEVE 2,955,213

TRANSISTOR AMPLIFIER WITH STEPPED OUTPUT

Filed Aug. 10, 1956

INVENTOR.
DONALD K. SCHAEVE
BY
Carlson, Pitzner, Hubbard & Wolfe
ATTORNEYS

United States Patent Office 2,955,213

Patented Oct. 4, 1960

2,955,213

TRANSISTOR AMPLIFIER WITH STEPPED OUTPUT

Donald K. Schaeve, Rockford, Ill., assignor to Barber-Colman Company, Rockford, Ill., a corporation of Illinois Filed Aug. 10, 1956, Ser. No. 603,295

1 Claim. (Cl. 307—88.5)

This invention relates generally to control apparatus which is sensitive to variations of a slowly changing direct current signal and, more particularly, to an amplifier including a transistor for controlling the energization of a load device such as a relay in response to variations in the amplitude of the signal.

One object of the invention is to provide a novel direct current transistor amplifier whose output signal varies abruptly between high and low values in response to gradual changes of the input signal through corresponding values.

Another object is to achieve abrupt changes in the output signal of the amplifier through the provision of a novel coupling providing regenerative feedback from the output circuit to the input circuit while avoiding amplification of changes in the output signal due to variations in the transistor characteristics with changes of ambient temperature and supply voltages.

A further object is to provide a direct current transistor amplifier which utilizes alternating current to provide regenerative feedback while enabling the input circuit to be isolated from direct current flow in the output circuit.

A more detailed object is to obtain alternating current for regenerative feedback by providing reactance elements which cooperate with the transistor in a novel manner to produce oscillations variable in strength with the magnitude of the input signal.

Other objects and advantages of the invention will become apparent from the following detailed description taken in connection with the accompanying drawings, in which.

Figure 1:
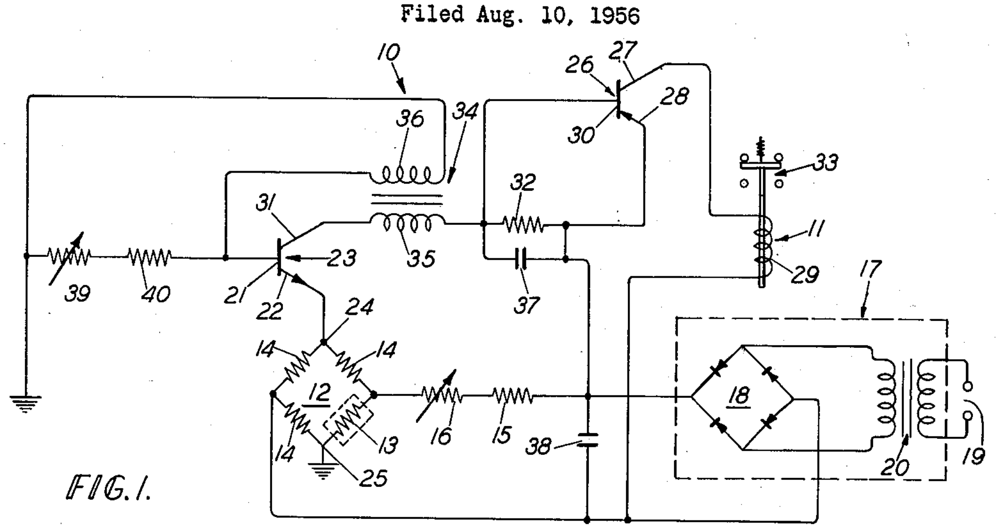
Figure 1 is a circuit diagram of control apparatus embodying the novel features of the present invention.

The invention is shown in the drawings for purposes of illustration embodied in an amplifier 10 for energizing and deenergizing a relay 11 in response to variations in the magnitude of a direct current input signal which is derived from a source 12 and varies with changes of a condition being controlled. In this instance, the source is a four terminal bridge formed by a temperature sensitive resistance element 13 and three fixed resistors 14 of equal value and having its input terminals connected in series with a fixed resistor 15 and a manually variable resistor 16 across the output terminals of a direct current source 17, the latter comprising a full wave rectifier 18 supplied from a suitable alternating current source 19 through a transformer 20. The input signal for the amplifier appearing across the bridge output terminals varies in magnitude with deviations in the temperature of the sensing resistor 13 from a balance point and is of one polarity or the other depending on the direction of deviation of the temperature, the element herein being of the type whose resistance varies directly rather than inversely in proportion to changes of its temperature.

From the bridge 12, the condition responsive signal is applied between input and common electrodes 21 and 22 of a first stage transistor 23 by connecting the respective electrodes to the bridge output terminals 24 and 25, the common electrode being connected directly to one terminal 24 by a conductor and the input electrode being connected to the other terminal 25 through ground. While the output signal of the transistor may be sensed directly by the relay 11, further amplification is desired in this instance and the means for sensing the output current of the transistor comprises a second stage transistor 26 having an output circuit extending between output and common electrodes 27 and 28 and in series through the direct current source 17 and the coil 29 of the relay. Both transistors shown are of the three electrode junction type connected with their emitters as the electrodes 22 and 28 common to the input and output circuits, their bases as the input electrodes 21 and 30, and their collectors as the output electrodes 31 and 27. Specific transistors found to give satisfactory operation were a type 200 n-p-n junction transistor manufactured by Texas Instruments, Incorporated of Dallas, Texas for the first transistor 23 and a type 2N43 p-n-p junction transistor manufactured by General Electric Company of Syracuse, New York for the second transistor 26.

The output signal of the first transistor 23 appears as a voltage drop across a load impedance, herein a resistor 32, connected in the output circuit which extends from the collector 31 in series through the resistor and the direct current source 17 to one input terminal of the bridge 12 between two of the fixed resistors 14 and, from this input terminal through the bridge to the emitter 22. This signal is applied to the input of the second transistor 26 by connecting the base 30 and the emitter 28 thereof directly to opposite ends of the load resistor. The polarity of the voltage applied by the direct current source 17 to each of the collectors 31 and 27 is such as to bias the same in a so-called nonconductive direction for obtaining "transistor action," that is, variation of the collector current as a function of the current flow through the emitter-base junction of the associated transistor. In the case of the first transistor 23 which is of the n-p-n type, the collector 31 is connected to the positive terminal of the source 17, the collector 27 of the second transistor 26 being connected to the negative terminal of the source.

In the systems of the above character for controlling a device such as the relay 11, it is desirable that the amplified output signal change abruptly between high and low levels in which the relay is fully energized and deenergized respectively in order to achieve a positive action of the relay and avoid chatter and arcing of its contacts 33. This is accomplished in accordance with the present invention by coupling the input and output circuits of the first transistor 23 in a novel manner to obtain regenerative feedback while isolating the input circuit from direct current flow in the output circuit and thereby avoiding amplification of variations in the output signal due to changes of supply voltage and ambient temperature. To this end, reactance elements are connected to at least one of the input and output circuits to cooperate with the transistor and generate an alternating output circuit current which varies in amplitude with changes in the magnitude of the input signal from the bridge. The alternating current then is fed back to the input circuit through a path adapted to block direct current and is utilized to vary the conductive bias between the base 21 and the emitter 22 correspondingly to produce abrupt changes of output circuit current in response to gradual changes in the input signal.

The generation of alternating currents which vary with the input signal from the bridge 12 and transmittal of such currents to the input circuit of the first transistor 23 is effected in this instance simply by the provision of a transformer 34 having its primary winding 35 connected in series with the collector 31 between the latter and the load resistor 32 and a secondary winding 36 coupled to the input circuit by connecting one terminal directly to the base 21 and the other terminal to ground and through the latter and the bridge to the emitter 22. With this arrangement, the parts of the transformer constitute the reactance elements which have a resonant frequency dependent on the inductance of the windings 35 and 36 and the intercoil capacitance thereof. Also, the transformer provides the path which passes alternating current to the input circuit while blocking direct current so as to isolate the input circuit from such current in the output circuit. To obtain a regenerative action, the phase of the voltage of the secondary winding terminal connected to the base 21 is opposite to the phase of the voltage of the primary winding terminal connected to the collector, the conductive bias between the base and the emitter due to the feedback then increasing and decreasing respectively in response to increases and decreases of collector current.

The alternating currents generated in the oscillator formed by the first transistor 23 and the transformer 34, in addition to effecting regenerative feedback for abrupt changes of the current in the transistor output circuit in response to gradual changes of the input signal, also may be utilized for energization of a load device such as the relay 11. In the present instance, however, where the relay is of the direct current type and a direct current output signal is desired, the oscillator currents are shunted around the load resistor 32 through a paralleling capacitor 37 so that only a unidirectional voltage appears across this resistor. The oscillator currents also are shunted around the direct current source 17 through a capacitor 38 connected across the output terminals of the rectifier 18.

Variation in the differential between the values of input signal voltage at which the relay 11 pulls in and drops out is effected by varying the effective amount of regenerative feedback between the input and output circuits of the first transistor 23. While this may be accomplished in various ways such as by employing a variable degenerative feedback, a variable resistor 39 is connected in series with a fixed resistor 40 across the transformer secondary 36 in this instance for variation of the regenerative feedback, the value of the variable resistor determining the amount of feedback energy which is shunted away from the input circuit and through the resistors.

Figure 2:
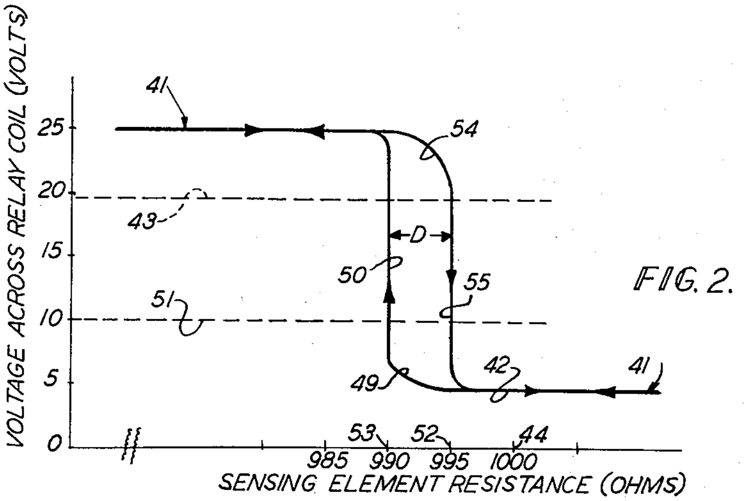
Fig. 2 is a chart showing variation of the output voltage of the apparatus with the value of a condition sensing element.

In the operation of the improved amplifier, let it be assumed that the value of the sensing resistor 13 is equal to that of the other bridge resistors 14 so that the bridge 12 is balanced and the voltage applied thereby between the base 21 and emitter 22 of the first transistor 23 is of zero or a negligibly small value. Under this condition, current flow in the input circuit is of a similar zero or negligibly small value with a corresponding current through the load resistor 32 in the output circuit and a low voltage across the relay coil 29. This condition is illustrated in Fig. 2 on a curve 41 of relay voltage plotted against sensing element resistance, the value of relay voltage indicated at 42 on the curve being well below the pull-in value indicated by a line 43 when the resistance is at its balance value 44.

Upon decrease of the controlled temperature and of the sensing element resistance from the balance value, a voltage is applied by the bridge 12 between the base 21 and emitter 22 to bias the latter in a conductive direction, that is, negatively with respect to the base in the case of the n-p-n transistor shown. The amount of such voltage for a given variation of element resistance from the balance value may be adjusted by varying the value of the resistor 16 and thereby the voltage applied to the input terminals of the bridge. The conductive bias on the emitter results in current flow through the base-emitter junction and, with the collector 31 biased nonconductively by the source 17, a corresponding current flows in the collector circuit and through the load resistance 32 to apply a conductive bias between the input electrodes 28 and 30 of the second transistor 26. This results in an increase of current in the collector circuit of the latter and through the relay coil 29 to raise the relay voltage.

Figure 3:
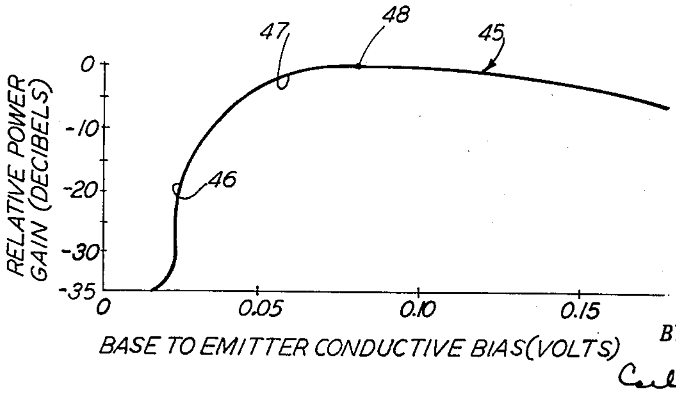
Fig. 3 is a chart showing variation of the relative power gain of the amplifier with changes of conductive bias between the transistor input electrodes.

The increase of current through the collector 31 of the first transistor 23 in response to the decrease of sensing element resistance below the balance value 44 results in an increase of power gain of the amplifier with respect to alternating currents. Such gain may be defined as the ratio of the power developed in the alternating current output circuit, herein including the transformer primary 35, to the power delivered to the transistor input. Referring to Fig. 3 in which a curve 45 represents the variation of relative gain of the amplifier in decibels with changes of the conductive bias in volts applied between the base and the emitter, it will be seen that, for low values of such bias and as the latter increases from a value slightly higher than zero, the gain increases rapidly along the curve as indicated at 46. With higher values of base-emitter conductive bias, the curve flattens sharply as indicated at 47, the gain increasing from this point gradually to a maximum at 48 and then decreasing gradually.

At some critical value of conductive bias between the base 21 and the emitter 22, the power gain of the transistor 23 and the amount of energy fed back to the base-emitter circuit are sufficient to sustain oscillations at the resonant frequency of the oscillator elements, the oscillations being initiated by random noise in the circuit when the critical value is reached. Once the oscillations start, the resulting alternating current signal in the transformer secondary 36 is rectified by the base-emitter junction and the average conductive bias between the base and the emitter increases with corresponding increases of power gain and collector current. This action is cumulative and continues until a stable operating condition is reached near the point 48 of maximum gain. To effect an abrupt increase of collector current, the critical value of conductive bias at which oscillations are initiated corresponds to a value of gain on the steep part 46 of the curve 45 below the maximum value.

Before the oscillatory condition is established, current flow through the collector 31 and the load resistor 32 and therefore the relay voltage increase gradually in response to increase of the bridge signal at a slow rate from zero, such gradual increase of relay voltage being indicated at 49 on the curve 41. As the cumulative feedback effect takes place after the oscillatory condition is reached, however, the collector current increases abruptly and the relay voltage rises rapidly as indicated at 50 to a value above the pull-in value 43 even though the bridge signal remains the same.

The cumulative feedback action and the nonlinear relation of the power gain and the conductive bias between the base 21 and the emitter 22 also are utilized to advantage in obtaining an abrupt change of relay voltage from above its pull-in value 43 to below its drop-out value 51 in response to increase of the bridge signal gradually through a corresponding value 52 less than the balance value 44 but higher than the value 53 at which the abrupt increase of relay voltage took place. As the resistance of the sensing element 13 increases gradually through the drop-out value 52, the conductive bias applied between the base 21 and the emitter 22 by the bridge 12 decreases with a corresponding reduction in the power gain. The collector current and therefore the amount of energy fed back to the input circuit through the transformer 34 similarly becomes less so that the relay voltage also decreases gradually as indicated at 54 in Fig. 2.

When the average conductive bias between the base 21 and the emitter 22 resulting from both the bridge signal and feedback signal has reached a low value where the power gain is on the steep part 46 of its curve 45 in Fig. 3, the cumulative feedback action becomes very pronounced with collector current pulses at the oscillator frequency decreasing in amplitude and the corresponding feedback pulses becoming progressively weaker so that the circuit goes into a nonoscillatory state. As a result the relay voltage drops abruptly as indicated at 55 in Fig. 2 and the relay drops out. The value of sensing element resistance at which the circuit becomes nonoscillatory and the relay 11 drops out may be varied by adjusting the setting of the variable feedback resistor 39. When the latter is of a relatively high value, more feedback energy is diverted to the input circuit of the first transistor 23 to sustain oscillations and the element resistance must increase to a higher value with a correspondingly lower bridge signal before the transition to the nonoscillatory state. This results in a larger differential indicated at D in Fig. 2 between the values 53 and 52 of element resistance at which the relay pulls in and drops out. Although the drop-out value 52 of element resistance is shown herein as being less than the balance value 44, it may also be larger. Under the latter condition, the unidirectional output voltage of the bridge 12 is of a polarity to bias the emitter nonconductively. Thus, to sustain oscillations, the amount of feedback energy delivered to the input circuit by the transformer 34 must be large enough to overcome the effect of such nonconductive bias.

In one system constructed substantially as described above, satisfactory operation was obtained utilizing a type P–2944 transformer manufactured by Merit Coil and Transformer Corp. of Chicago, Illinois, and a type KCP relay manufactured by Potter and Brumfield of Princeton, Indiana, and having a coil resistance of 2500 ohms. Each of the fixed bridge resistors 14 had a value of 1000 ohms and the fixed and variable resistors 15 and 16 in series with the source 17 between the bridge output terminals were valued respectively at 100 ohms and at 1000 ohms total resistance. The source 17 supplied 18 volts and the capacitors 37 and 38 were rated at 50 microfarads each with the load resistor 32 rated at 1000 ohms. In the feedback circuit, the values of the fixed and variable resistors 40 and 39 were 150 ohms and 50 ohms total resistance respectively, the frequency of oscillation being approximately 1000 cycles per second.

From the foregoing, it will be apparent that the voltage across the relay coil 29 varies quickly through its pull-in and drop-out values 43 and 51 in response to gradual changes of the sensing element resistance through corresponding values 53 and 52. The relay thus operates positively with little tendency for arcing or chatter of the relay contacts 33 when subjected to vibration. This advantageous result is obtained while reducing sensitivity to supply voltage and ambient temperature variations by utilizing alternating current feedback elements which are controlled in a novel manner in response to changes in the input signal from the bridge 12 and which enable the input circuit of the transistor 23 to be isolated from direct currents in the output circuit.

I claim as my invention:

A snap-action control circuit for utilizing slight resistance changes in a condition responsive resistor to actuate a load sensitive to changes of direct current between low and high levels which comprises a junction transistor having emitter, base and collector electrodes, a four-terminal bridge network including said condition responsive resistor, means for connecting a first pair of opposite bridge terminals to a direct current voltage source, an isolating transformer with primary and secondary windings having a resonant oscillatory frequency, an input circuit connecting the second pair of opposite bridge terminals and said secondary winding in series between said base and said emitter, an output circuit connecting said primary winding and said load in series with a direct current voltage source between said collector and said input circuit to provide a direct current power gain varying abruptly with base to emitter voltage changes, said transformer windings being connected in relative polarity for regenerative feedback when the power gain is sufficient to initiate oscillations to thereby provide a snap-action change in the direct current component in said load.

References Cited in the file of this patent

UNITED STATES PATENTS

| | | |
|---|---|---|
| 2,644,893 | Gehman | July 7, 1953 |
| 2,773,219 | Aron | Dec. 4, 1956 |
| 2,773,220 | Aron | Dec. 4, 1956 |
| 2,776,375 | Keiper | Jan. 1, 1957 |

FOREIGN PATENTS

| | | |
|---|---|---|
| 730,597 | Great Britain | May 25, 1955 |